US009299941B2

(12) United States Patent
Lee et al.

(10) Patent No.: US 9,299,941 B2
(45) Date of Patent: Mar. 29, 2016

(54) ORGANIC SEMICONDUCTOR DEVICE AND METHOD OF MANUFACTURING THE SAME

(75) Inventors: Ji Youl Lee, Seoul (KR); Jong-Won Chung, Hwaseong-si (KR); Jeong-il Park, Seongnam-si (KR); Byung-Wook Yoo, Seongnam-si (KR); Yong-Wan Jin, Seoul (KR); Sang-Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 818 days.

(21) Appl. No.: 13/348,246

(22) Filed: Jan. 11, 2012

(65) Prior Publication Data

US 2012/0181519 A1    Jul. 19, 2012

(30) Foreign Application Priority Data

Jan. 13, 2011   (KR) .................. 10-2011-0003674
Jan. 9, 2012    (KR) .................. 10-2012-0002283

(51) Int. Cl.
*H01L 51/30*   (2006.01)
*H01L 51/10*   (2006.01)
*H01L 51/05*   (2006.01)

(52) U.S. Cl.
CPC ........... *H01L 51/105* (2013.01); *H01L 51/0525* (2013.01); *H01L 51/0545* (2013.01)

(58) Field of Classification Search
CPC ................. H01L 51/0508; H01L 51/105
USPC ............. 257/40, 347, E51.005, E51.024, 257/E51.027
See application file for complete search history.

(56) References Cited

U.S. PATENT DOCUMENTS

| 7,868,537 | B2 * | 1/2011 | Meijer et al. ................. 313/504 |
| 2005/0189536 | A1 * | 9/2005 | Zschieschang et al. ........ 257/40 |
| 2008/0012024 | A1 | 1/2008 | Song et al. |
| 2008/0048184 | A1 | 2/2008 | Oh et al. |
| 2008/0241990 | A1 | 10/2008 | Kim et al. |
| 2009/0071826 | A1 * | 3/2009 | Kamahori et al. ............ 204/418 |
| 2010/0065830 | A1 * | 3/2010 | Kim et al. ........................ 257/40 |
| 2012/0199822 | A1 * | 8/2012 | Kamura et al. ................. 257/40 |

OTHER PUBLICATIONS

Bert de Boer et al, Adv. Mater, (2005).
Guillermo C. Bazan et al, PNAS, (2008).
T.-Q. Nguyen et al, JACS, (2008).
Proceedings of the IEEE (2005).
Adv. Mater. 2008, 20, 1-6 "Electronic Interfaces".
Adv. Mater. 2008, 20, 2491-2496 "Structural Characterization of Conjugated Polyelectrolyte Electron Transport Layers by NEXAFS Spectroscopy".
J. Am. Chem. Soc. 2007, 129, 10976-10977 "Ion Motion in Conjugated Polyelectrolyte Electron Transporting Layers".

* cited by examiner

*Primary Examiner* — Ermias Woldegeorgis
(74) *Attorney, Agent, or Firm* — Harness, Dickey & Pierce, P.L.C.

(57) ABSTRACT

An organic semiconductor device includes an organic semiconductor, an electrode electrically connected to the organic semiconductor, and a self-assembled monolayer positioned between the organic semiconductor and the electrode, the self-assembled monolayer including a monomer having an anchor group at one end and an ionic functional group at another end.

12 Claims, 12 Drawing Sheets

ORGANIC SEMICONDUCTOR DEVICE AND METHOD OF MANUFACTURING THE SAME

CROSS-REFERENCE TO RELATED APPLICATIONS

This application claims priority under 35 U.S.C. 119 to Korean Patent Application No. 10-2011-0003674, filed in the Korean Intellectual Property Office on Jan. 13, 2011, and Korean Patent Application No. 10-2012-0002283, filed in the Korean Intellectual Property Office on Jan. 9, 2012, the entire contents of each of which are incorporated herein by reference.

BACKGROUND

1. Field

Example embodiments relate to an organic semiconductor device and a method of manufacturing the same.

2. Description of the Related Art

A flat panel display, e.g., a liquid crystal display (LCD), an organic light emitting diode (OLED) display, and/or an electrophoretic display, includes multiple pairs of field generating electrodes and an electro-optical active layer interposed therebetween. The liquid crystal display (LCD) includes an electro-optical active layer of a liquid crystal layer, and the organic light emitting diode (OLED) display includes an electro-optical active layer of an organic emission layer.

One of paired field generating electrodes is generally connected to a switching element and applied with an electrical signal, and the electro-optical active layer transforms the electrical signal to an optical signal to display an image.

The flat panel display includes a three-terminal element of a thin film transistor (TFT) as a switching element, and also a gate line transferring a scan signal for controlling the thin film transistor and a data line transferring a data signal to be applied to a pixel electrode.

Among the thin film transistors, an organic thin film transistor (OTFT) including an organic semiconductor instead of the inorganic semiconductor, e.g., silicon (Si), has been actively researched.

The organic thin film transistor may be shaped in a fiber or a film according to the organic material characteristic, so the OTFT has drawn attention for flexible display devices.

By including the organic thin film transistor, the organic semiconductor device, e.g., an organic solar cell, and/or an organic sensor, includes an organic semiconductor and a metal electrode.

However, the contact resistance may be increased when the organic semiconductor directly contacts the metal electrode. In addition, the available kinds of metals for an electrode are limited depending upon the physical properties of the organic semiconductor, so low resistance metals that are relatively generally used are limited in use, and high cost metals, e.g., gold (Au) are used, causing an increase of process cost.

SUMMARY

Example embodiments provide organic semiconductor device of which the process cost is reduced while the contact resistance between the organic semiconductor and the metal electrode is decreased to improve the device characteristics. Example embodiments also provide a method of manufacturing an organic semiconductor device.

According to example embodiments, an organic semiconductor device may include an electrode electrically connected to an organic semiconductor, and a self-assembled monolayer positioned between the organic semiconductor and the electrode, the self-assembled monolayer including a monomer having an anchor group at one end and an ionic functional group at another end.

The anchor group may be on a side of the electrode, and the ionic functional group may be on a side of the organic semiconductor. The ionic functional group may include cations, and the self-assembled monolayer may include anions configured to form a pair with the cations. The cations may include at least one of substituted or unsubstituted ammonium cations, substituted or unsubstituted sulfonium cations, sodium cations, and a combination thereof, and the anions may include at least one of bromine anions, borate anions, halide, perchlorate anions, phosphate anions, sulfonate anions, nitrate anions, amide anions, and a combination thereof.

The anions may include at least one of trifluoromethane sulfonate, trifluoromethanesulfonylamide, tetrakis(1-imidazolyl)borate, tetrakis[3,5-bis(trifluoromethyl)phenyl]borate, $BF_4^-$, $PF_6^-$, $AlCl_4^-$, $Al_2Cl_7^-$, $NO_3^-$, and a combination thereof. The ionic functional group may include anions, and the self-assembled monolayer may include cations configured to form a pair with the anions. The anions may include at least one of bromine anions, borate anions, halide, perchlorate anions, phosphate anions, sulfonate anions, nitrate anions, amide anions, and a combination thereof, and the cations may include at least one of substituted or unsubstituted ammonium cations, substituted or unsubstituted sulfonium cations, sodium cations, and a combination thereof.

The anchor group may include at least one of —SH, —SOR$^1$, and a combination thereof, wherein R$^1$ is at least one of hydrogen, substituted or unsubstituted $C_1$ to $C_{30}$ alkyl group, substituted or unsubstituted $C_1$ to $C_{30}$ aryl group, and a combination thereof. The self-assembled monolayer may include a monomer represented by the following Chemical Formula 1 or 2:

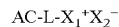   [Chemical Formula 1]

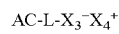   [Chemical Formula 2]

wherein, in Chemical Formulae 1 and 2, AC is at least one of —SH, —SOR$^1$, and a combination thereof, R$^1$ may be at least one of hydrogen, substituted or unsubstituted $C_1$ to $C_{30}$ alkyl group, substituted or unsubstituted $C_1$ to $C_{30}$ aryl group, and a combination thereof, $X_1^+$ is a cation and $X_2^-$ is an anion configured to form a pair with $X_1^+$, $X_3^-$ is an anion and $X_4^+$ is a cation configured to form a pair with $X_3^-$, and L is at least one of a single bond, a substituted or unsubstituted $C_1$ to $C_{30}$ alkylene group, a substituted or unsubstituted $C_3$ to $C_{30}$ cycloalkylene group, a substituted or unsubstituted $C_6$ to $C_{30}$ arylene group, a substituted or unsubstituted $C_3$ to $C_{30}$ cycloalkenylene group, a substituted or unsubstituted $C_7$ to $C_{20}$ an arylalkylene group, a substituted or unsubstituted $C_1$ to $C_{20}$ heteroalkylene group, a substituted or unsubstituted $C_2$ to $C_{30}$ heterocycloalkylene group, a substituted or unsubstituted $C_2$ to $C_{30}$ heteroarylene group, a substituted or unsubstituted $C_2$ to $C_{30}$ alkenylene group, a substituted or unsubstituted $C_2$ to $C_{30}$ alkynylene group, a halogen-containing organic group, and a combination thereof.

The self-assembled monolayer may have a bottom contact structure contacting the organic semiconductor at a bottom surface of the organic semiconductor. The electrode may include at least one of gold (Au), copper (Cu), nickel (Ni), silver (Ag), aluminum (Al), molybdenum (Mo), chromium (Cr), tantalum (Ta), titanium (Ti), and an alloy thereof. The self-assembled monolayer may have a thickness of about 2 to about 100 Å. The organic semiconductor device may include at least one of an organic thin film transistor, an organic solar cell, and an organic sensor.

According to example embodiments, a method of manufacturing an organic semiconductor device may include providing a self-assembled monolayer on a electrode, the self-assembled monolayer including a monomer having an anchor group at one end and an ionic functional group at another end, and providing an organic semiconductor on the self-assembled monolayer.

Providing the self-assembled monolayer may include providing the monomer having the anchor group on the electrode to attach the anchor group on a surface of the electrode, and providing the other end of the monomer with the ionic functional group. Providing the monomer on the electrode may include performing at least one method including spin coating, dip coating, and chemical vapor deposition (CVD). Providing the other end of the monomer with the ionic functional group may include at least one of binding cations with anions in pairs, and binding anions with cations in pairs.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
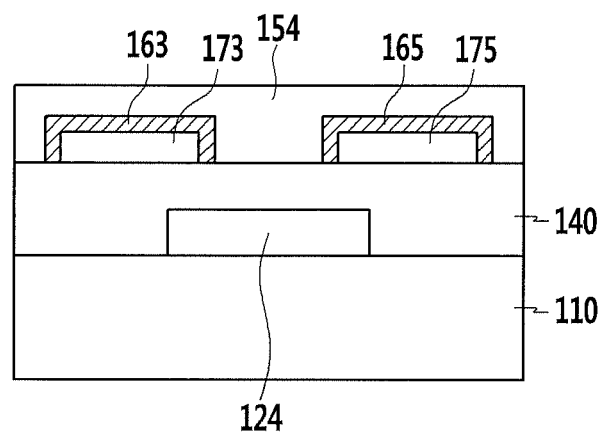
FIG. 1 is a cross-sectional view showing the organic thin film transistor according to example embodiments.

Example embodiments will be described more fully hereinafter with reference to the accompanying drawings. This disclosure may, however, be embodied in many different forms and should not be construed as limited to example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, the organic semiconductor device according to example embodiments is described. FIG. 1 is a cross-sectional view showing the organic thin film transistor according to example embodiments.

A gate electrode 124 may be formed on a substrate 110 made of, for example, transparent glass, silicon, or plastic. The gate electrode 124 may be connected to a gate line (not shown) transferring a gate signal. A gate insulating layer 140 may be formed on the gate electrode 124.

The gate insulating layer 140 may be made of an organic material or an inorganic material. Examples of the organic material may include a soluble polymer compound, e.g., a polyvinyl alcohol-based compound, a polyimide-based compound, a polyacryl-based compound, a polystyrene-based compound, and benzocyclobutane (BCB), and examples of the inorganic material may include silicon nitride ($SiN_x$), aluminum oxide ($Al_2O_3$), and silicon oxide ($SiO_2$).

A source electrode 173 and a drain electrode 175 may be formed on the gate insulating layer 140. The source electrode 173 and the drain electrode 175 may face each other in the center of the gate electrode 124. The source electrode 173 may be electrically connected to the data line (not shown) transferring the data signal.

The source electrode 173 and the drain electrode 175 may include at least one metal of gold (Au), copper (Cu), nickel (Ni), silver (Ag), aluminum (Al), molybdenum (Mo), chromium (Cr), tantalum (Ta), titanium (Ti), or an alloy thereof.

An organic semiconductor 154 may be formed on the source electrode 173 and the drain electrode 175. The organic semiconductor 154 may be formed of at least one of pentacene and a precursor thereof, tetrabenzoporphyrin and a derivative thereof, polyphenylenevinylene and a derivative thereof, polyfullerene and a derivative thereof, polythienylenevinylene and a derivative thereof, polythiophene and a derivative thereof, polythiazole and a derivative thereof, polythienothiophene and a derivative thereof, polyarylamine, and a derivative thereof, phthalocyanine and a derivative thereof, metallized phthalocyanine or a halogenated derivative thereof, perylenetetracarboxylic dianhydride (PTCDA), naphthalenetetracarboxylic dianhydride (NTCDA) or an imide derivative thereof, perylene, or coronene or a derivative including a substituent thereof, and copolymer thereof.

Self-assembled monolayers (SAM) 163 and 165 may be formed between the organic semiconductor 154 and the source electrode 173 and between the organic semiconductor 154 and the drain electrode 175. The self-assembled monolayers 163 and 165 have a bottom contact structure contacting the organic semiconductor 154 at the bottom of the organic semiconductor 154. The self-assembled monolayers 163 and 165 are described with reference to FIG. 2.

Figure 2:
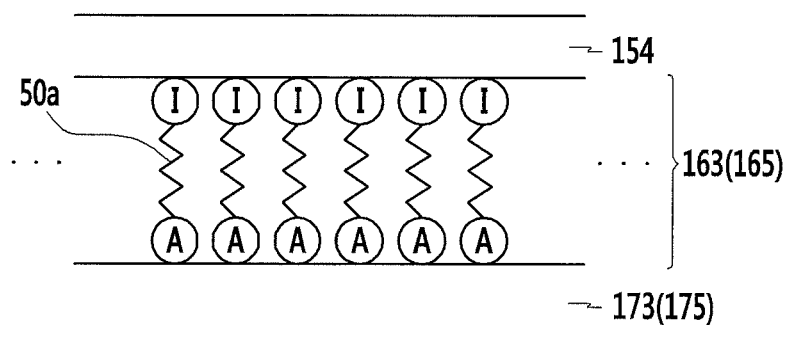
FIG. 2 is a schematic view showing one example of a self-assembled monolayer according to example embodiments.

FIG. 2 is a schematic diagram showing one example of a self-assembled monolayer according to example embodiments. The self-assembled monolayers 163 and 165 have a structure in which a plurality of monomers 50a are substantially vertically aligned with regard to the substrate.

Each monomer 50a may have one end having an anchor group (A) and the other end having an ionic functional group (I). The anchor group (A) may be aligned on the side of the source electrode 173 and the drain electrode 175, and the ionic functional group (I) may be aligned on the side of the organic semiconductor 154.

The anchor group (A) may be a functional group that is capable of being self-aligned on the source electrode 173 and the drain electrode 175, and may include, for example, —SH, —$SOR^1$, or a combination thereof. Herein, $R^1$ may be hydrogen, substituted or unsubstituted $C_1$ to $C_{30}$ alkyl group, substituted or unsubstituted $C_1$ to $C_{30}$ aryl group, or a combination thereof.

The ionic functional group (I) may include cations or anions. When the ionic functional group (I) includes cations, the ionic functional group (I) also includes anions forming a pair with the cations.

In example embodiments, the cations may include substituted or unsubstituted ammonium ion, substituted or unsubstituted sulfonium ion, sodium ion, or a combination thereof, and the pairing anions may include bromine anions, borate anions, halide, perchlorate anions, phosphate anions, sulfonate anions, nitrate anions, amide anions, or a combination thereof. The anions may include, for example, trifluoromethane sulfonate represented by the following Chemical Formula A, trifluoromethanesulfonylamide, tetrakis(1-imidazolyl)borate represented by the following Chemical Formula B, tetrakis[3,5-bis(trifluoromethyl)phenyl]borate represented by the following Chemical Formula C, $BF_4^-$, $PF_6^-$, $AlCl_4^-$, $Al_2Cl_7^-$, $NO_3^-$, or a combination thereof.

[Chemical Formula A]
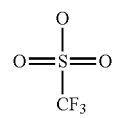

[Chemical Formula B]
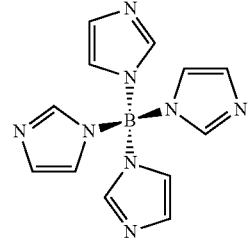

[Chemical Formula C]
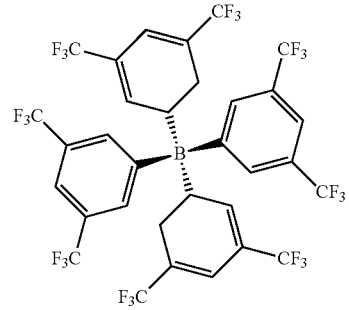

When the ionic functional group (I) includes anions, the ionic functional group (I) may include the cations forming a pair with the anions. In example embodiments, the anions may include bromine anions, borate anions, halide, perchlorate anions, phosphate anions, sulfonate anions, nitrate anions, amide anions, or a combination thereof, and the cations may include substituted or unsubstituted ammonium ion, substituted or unsubstituted sulfonium ion, sodium ion, or a combination thereof.

The anions may include, for example, trifluoromethane sulfonate, trifluoromethanesulfonylamide, tetrakis(1-imidazolyl)borate, tetrakis[3,5-bis(trifluoromethyl)phenyl]borate, $BF_4^-$, $PF_6^-$, $AlCl_4^-$, $AlCl_7^-$, $NO_3^-$, or a combination thereof.

The self-assembled monolayers 163 and 165 may include a monomer represented by the following Chemical Formula 1 or Chemical Formula 2.

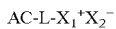  [Chemical Formula 1]

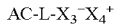  [Chemical Formula 2]

In Chemical Formulae 1 and 2, AC is —SH, —$SOR^1$ ($R^1$ may be hydrogen, substituted or unsubstituted $C_1$ to $C_{30}$ alkyl group, substituted or unsubstituted $C_1$ to $C_{30}$ aryl group, or a combination thereof), or a combination thereof, which is an anchor group that is capable of being self-aligned on the source electrode 173 and the drain electrode 175, $X_1^+$ is a cation and $X_{2-}$ is an anion being in a pair with $X_1^+$, as mentioned above, $X_3^-$ is an anion and $X_4^+$ is a cation being in a pair with $X_3^-$, as mentioned above, and L is a linking group that links the anchor group and ionic functional group, and is a single bond, a substituted or unsubstituted $C_1$ to $C_{30}$ alkylene group, a substituted or unsubstituted $C_3$ to $C_{30}$ cycloalkylene group, a substituted or unsubstituted $C_6$ to $C_{30}$ arylene group, a substituted or unsubstituted $C_3$ to $C_{30}$ cycloalkenylene group, a substituted or unsubstituted $C_7$ to $C_{20}$ arylalkylene group, a substituted or unsubstituted $C_1$ to $C_{20}$ heteroalkylene group, a substituted or unsubstituted $C_2$ to $C_{30}$ heterocycloalkylene group, a substituted or unsubstituted $C_2$ to $C_{30}$ heteroarylene group, a substituted or unsubstituted $C_2$ to $C_{30}$ alkenylene group, a substituted or unsubstituted $C_2$ to $C_{30}$ alkynylene group, a halogen-containing organic group, or a combination thereof.

The self-assembled monolayers 163 and 165 may have a thickness as the length of monomer 50a, for example, a thickness of about 2 to 100 Å. The self-assembled monolayers 163 and 165 may act as a charge injecting layer between the organic semiconductor 154 and the source electrode 173 and between the organic semiconductor 154 and the drain electrode 175 to decrease the contact resistance therebetween, thereby increasing the charge mobility.

In addition, the self-assembled monolayers 163 and 165 decrease the contact resistance between the organic semiconductor 154 and the source electrode 173 and between the organic semiconductor 154 and the drain electrode 175, so that the self-assembled monolayers 163 and 165 may prevent or reduce limitations of a metal that is capable of being used as an electrode. Thereby, a comparative inexpensive low-resistance metal may be applied to reduce the process cost.

The method of manufacturing the organic thin film transistor of FIG. 1 is described with reference to FIG. 3 to FIG. 6. FIG. 3 to FIG. 6 are cross-sectional views sequentially showing the method of manufacturing the organic thin film transistor of FIG. 1.

Figure 3:
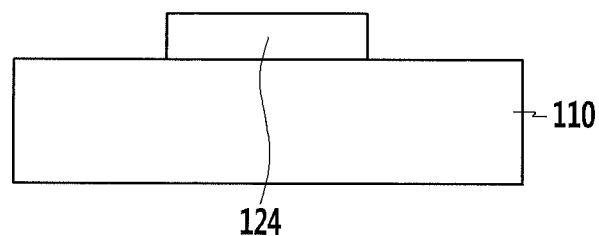
FIG. 3 to FIG. 6 are cross-sectional views sequentially showing the method of manufacturing the organic thin film transistor of FIG. 1.
Figure 4:
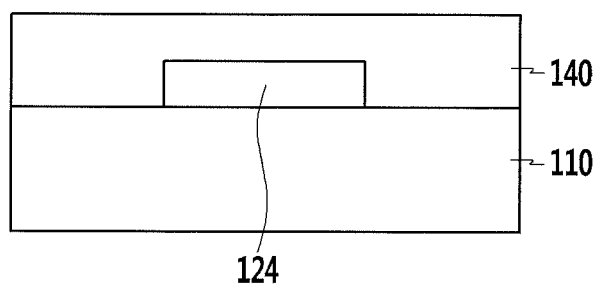

Referring to FIG. 3, a conductive layer may be formed on the substrate 110 by, for example, sputtering, and undergoes photolithography to provide a gate electrode 124. Referring to FIG. 4, a gate insulating layer 140 may be formed on the gate electrode 124. The gate insulating layer 140 may be formed by a solution process, for example, spin coating.

Figure 5:
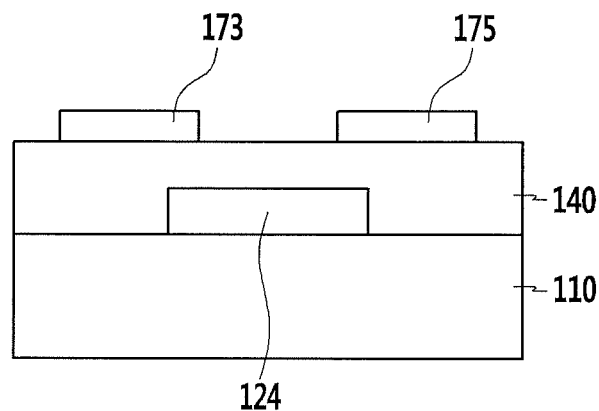

Referring to FIG. 5, a conductive layer may be formed on the gate insulating layer 140 by, for example, sputtering, and undergoes photolithography to provide a source electrode 173 and a drain electrode 175.

Figure 6:
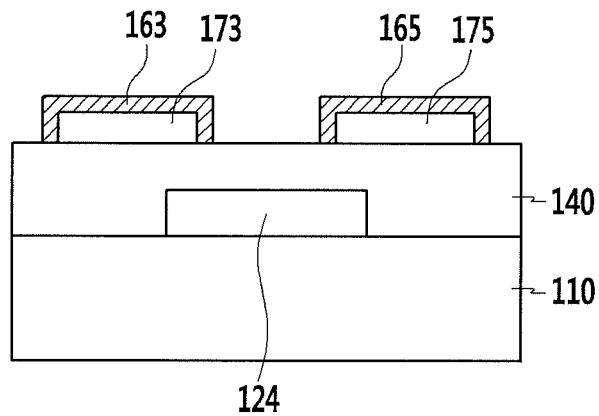

Referring to FIG. 6, self-assembled monolayers 163 and 165 may be formed on the source electrode 173 and the drain electrode 175, respectively. The self-assembled monolayers 163 and 165 provide a monomer having an anchor group on the source electrode 173 and the drain electrode 175 to fix the anchor group on the source electrode 173 and the drain electrode 175, and the other end of the monomer is provided with an ionic functional group.

Providing the monomer having one end of an anchor group on the source electrode 173 and the drain electrode 175 may be performed, for example, by dissolving a monomer having an anchor group in a solvent to provide a solution, coating the solution by a solution process, e.g., dip coating or spin coating, and drying the same. The anchor group may be self-aligned on the surface of source electrode 173 and drain electrode 175. The other end of monomer may be substituted by the ionic functional group.

Alternatively, providing the monomer having one end of an anchor group on the source electrode 173 and the drain electrode 175 may be performed, for example, by providing a monomer having an anchor group at one end by chemical vapor deposition (CVD) and substituting the other end of monomer with an ionic functional group.

The substituting the other end of the monomer with an ionic functional group may be performed by, for example, quaternarization synthesis of reacting a tertiary amine included in the other end of the monomer with, for example, methyl iodine or methyl bromine.

Referring to FIG. 1, an organic semiconductor 154 may be formed on the self-assembled monolayers 163 and 165. The organic semiconductor 154 may be formed by a dry process, e.g., chemical vapor deposition (CVD), or a solution process, e.g., spin coating, or inkjet printing.

Figure 7:
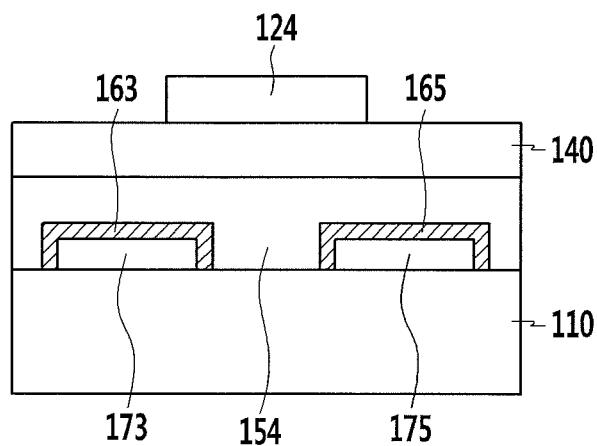
FIG. 7 is a cross-sectional view showing the organic thin film transistor according to example embodiments.

Hereinafter, the organic thin film transistor according to example embodiments is described with reference to FIG. 7. FIG. 7 is a cross-sectional view showing the organic thin film transistor according to example embodiments.

A source electrode 173 and a drain electrode 175 may be formed on a substrate 110 made of transparent glass, silicon, or plastic. The source electrode 173 and the drain electrode 175 may face each other while leaving a predetermined or given interval therebetween. The source electrode 173 may be electrically connected with a data line (not shown) transferring the data signal.

The source electrode 173 and the drain electrode 175 may include at least one metal of gold (Au), copper (Cu), nickel (Ni), silver (Ag), aluminum (Al), molybdenum (Mo), chromium (Cr), tantalum (Ta), titanium (Ti), or an alloy thereof.

An organic semiconductor 154 may be formed on the source electrode 173 and the drain electrode 175. The organic semiconductor 154 may be formed of at least one of pentacene and a precursor thereof, tetrabenzoporphyrin and a derivative thereof, polyphenylenevinylene and a derivative thereof, polyfullerene and a derivative thereof, polythienylenevinylene and a derivative thereof, polythiophene and a derivative thereof, polythiazole and a derivative thereof, polythienothiophene and a derivative thereof, polyarylamine and a derivative thereof, phthalocyanine and a derivative thereof, metallized phthalocyanine or a halogenated derivative thereof, perylenetetracarboxylic dianhydride (PTCDA), naphthalenetetracarboxylic dianhydride (NTCDA) or an imide derivative thereof; perylene, or coronene or a derivative including a substituent thereof, and a copolymer thereof.

Self-assembled monolayers 163 and 165 may be formed between the organic semiconductor 154 and the source electrode 173 and between the organic semiconductor 154 and the drain electrode 175. The self-assembled monolayers 163 and 165 may have a bottom contact structure contacting the organic semiconductor 154 at the bottom of the organic semiconductor 154.

The self-assembled monolayers 163 and 165 may include a monomer having one end of an anchor group and the other end of an ionic functional group. The anchor group may be self-aligned on the side of the source electrode 173 and the drain electrode 175, and the ionic functional group may be aligned on the side of the organic semiconductor 154. Thereby, the monomer may be substantially vertically aligned with respect to the substrate.

The anchor group may be a functional group that is capable of being self-aligned on the source electrode 173 and the drain electrode 175. The functional group may include, for example, a thiol group. The ionic functional group may include cations or anions. When the ionic functional group includes cations, the ionic functional group may also include anions forming a pair with the cations. When the ionic functional group includes anions, the ionic functional group may also include cations forming a pair with the anions.

The self-assembled monolayers 163 and 165 may include a monomer represented by the following Chemical Formula 1 or Chemical Formula 2.

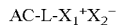   [Chemical Formula 1]

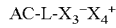   [Chemical Formula 2]

In Chemical Formulae 1 and 2, AC is —SH, —$SOR^1$ ($R^1$ may be hydrogen, substituted or unsubstituted $C_1$ to $C_{30}$ alkyl group, substituted or unsubstituted $C_1$ to $C_{30}$ aryl group, or a combination thereof), or a combination thereof, which is an anchor group that is capable of being self-aligned on the source electrode 173 and the drain electrode 175, $X_1^+$ is a cation and $X_2^-$ is an anion being a pair with $X_1^+$, as mentioned above, $X_3^-$ is an anion and $X_4^+$ is a cation being a pair with $X_3^-$, as mentioned above, and L is a linking group that links the anchor group and ionic functional group and is a single bond, a substituted or unsubstituted $C_1$ to $C_{30}$ alkylene group, a substituted or unsubstituted $C_3$ to $C_{30}$ cycloalkylene group, a substituted or unsubstituted $C_6$ to $C_{30}$ arylene group, a substituted or unsubstituted $C_3$ to $C_{30}$ cycloalkenylene group, a substituted or unsubstituted $C_7$ to $C_{20}$ an arylalkylene group, a substituted or unsubstituted $C_1$ to $C_{20}$ heteroalkylene group, a substituted or unsubstituted $C_2$ to $C_{30}$ heterocycloalkylene group, a substituted or unsubstituted $C_2$ to $C_{30}$ heteroarylene group, a substituted or unsubstituted $C_2$ to $C_{30}$ alkenylene group, a substituted or unsubstituted $C_2$ to $C_{30}$ alkynylene group, a halogen-containing organic group, or a combination thereof.

The self-assembled monolayers 163 and 165 may have a thickness the same as the length of the monomer 50a, for example, a thickness of about 2 to 100 Å. The self-assembled monolayers 163 and 165 may act as a charge injecting layer between the organic semiconductor 154 and the source electrode 173 and between the organic semiconductor 154 and the drain electrode 175 to decrease the contact resistance therebetween and to increase the charge mobility.

In addition, the self-assembled monolayers 163 and 165 decrease the contact resistance between the organic semiconductor 154 and the source electrode 173 and between the organic semiconductor 154 and the drain electrode 175, so the self-assembled monolayers 163 and 165 may prevent or reduce limitations of a metal applied to an electrode depending upon the organic semiconductor characteristics. A relatively low resistance metal, which is relatively inexpensive, may be applied to reduce the process costs.

A gate insulating layer 140 may be formed on the organic semiconductor 154. The gate insulating layer 140 may be made of an organic material or an inorganic material. Examples of the organic material may include a soluble polymer compound, e.g., a polyvinyl alcohol-based compound, a polyimide-based compound, a polyacryl-based compound, a polystyrene-based compound, and benzocyclobutane (BCB), and examples of the inorganic material may include silicon nitride ($SiN_x$), silicon oxide ($SiO_2$) and aluminum oxide (AlOx). A gate electrode 124 may be formed on the gate insulating layer 140.

Figure 8:
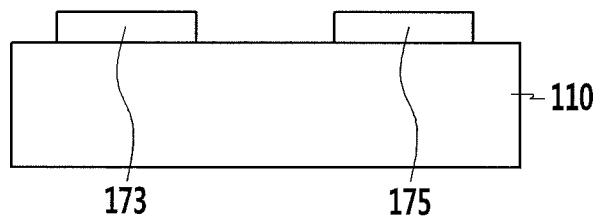
FIG. 8 to FIG. 11 are cross-sectional views sequentially showing the method of manufacturing the organic thin film transistor of FIG. 7.

Hereinafter, the method of manufacturing the organic thin film transistor of FIG. 7 is described with reference to FIG. 8 to FIG. 11, together with FIG. 7. FIG. 8 to FIG. 11 are cross-sectional views sequentially showing the method of manufacturing the organic thin film transistor of FIG. 7. Referring to FIG. 8, a conductive layer may be formed on the substrate 110 by, for example, sputtering, and undergoes photolithography to provide a source electrode 173 and a drain electrode 175.

Figure 9:
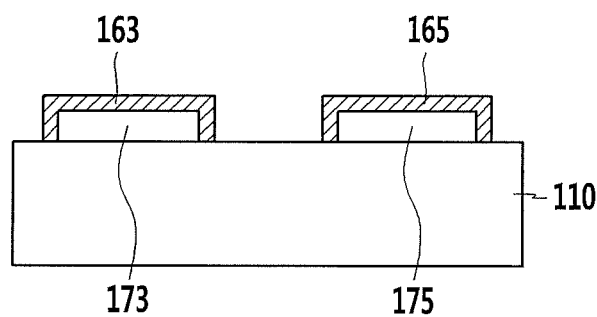

Referring to FIG. 9, self-assembled monolayers 163 and 165 may be formed on the source electrode 173 and the drain electrode 175, respectively. A monomer having an anchor group is aligned on the source electrode 173 and the drain electrode 175 by attaching the anchor group on the surfaces of the source electrode 173 and the drain electrode 175, and the other end of the monomer is substituted with an ionic functional group.

Providing the monomer having an anchor group on the source electrode 173 and the drain electrode 175 may be performed by dissolving the monomer having an anchor group in a solvent to provide a solution, coating the solution by a solution process, e.g., dip coating, or spin coating, and drying the same. The anchor group may be self-aligned on the surface of the source electrode 173 and the drain electrode 175. The other end of the monomer may be substituted with the ionic functional group.

Alternatively, the monomer having an anchor group on the source electrode 173 and the drain electrode 175 may be formed by, for example, providing a monomer having an anchor group at one end by chemical vapor deposition (CVD) and substituting the other end of the monomer with the ionic functional group.

Figure 10:
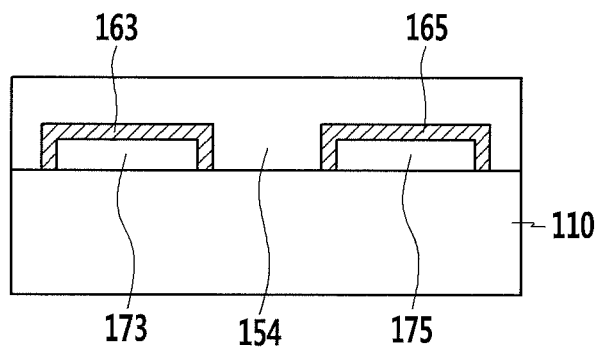
Figure 11:
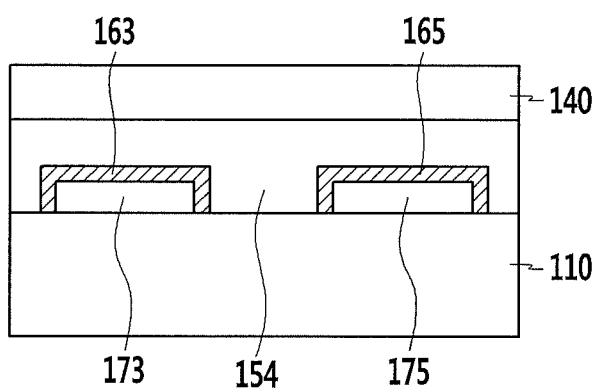

Referring to FIG. 10, an organic semiconductor 154 may be formed on the self-assembled monolayers 163 and 165. The organic semiconductor 154 may be formed by a dry process, e.g., chemical vapor deposition (CVD), or a solution process, e.g., spin coating, or inkjet printing. Referring to FIG. 11, a gate insulating layer 140 may be formed on the organic semiconductor 154. The gate insulating layer 140 may be formed by a solution process, e.g., spin coating.

Referring to FIG. 7, a conductive layer may be formed on the gate insulating layer 140 by, for example, sputtering, and undergoes photolithography to provide a gate electrode 124. The organic thin film transistor according to example embodiments may be applied to all organic semiconductor devices that include an organic semiconductor and an electrode, for example, an organic solar cell, and/or an organic sensor.

The following examples illustrate example embodiments in more detail. However, it is understood that the scope of the inventive concepts is not limited to these examples.

Synthesis of a Monomer for Self-Assembled Monolayer
Step 1:

To an acetonitrile solution (120 mL), 1,6-dibromohexane 27.7 g (0.10 mol) and potassium thioacetate 4.68 g (0.042 mol) are added and refluxed for 12 hours. The mixture solution is filtered at room temperature and acetonitrile is removed under reduced pressure. The obtained yellow solution is purified by silica gel column chromatography, Compound 1 is obtained 14.25 g with improved yield (59.6%).

Step 2:

A mixture of Compound 1 14.25 g (0.060 mol) and trimethylamine 34.58 g (0.595 mol) in dry tetrahydrofuran (250 mL) is stirred at room temperature overnight. The white precipitate is filtered, washed with dry THF and dried under a reduced pressure. Compound 2 is obtained in 72% yield.

Step 3:

A mixture of compound 2 (9.0 g (0.030 mol) in 47% hydrobromic acid 90 mL and ethanol 200 ml) is stirred for 2 days under $N_2$ condition. The solvent is removed under a reduced pressure. The resultant yellow oil is added in methanol and diethyl ether, and the white precipitate is obtained by reprecipitation. The final product is dried under reduced pressure, and a 51% yield of Compound 3, (6-mercaptohexyl) trimethylammonium bromide.

Figure 12:
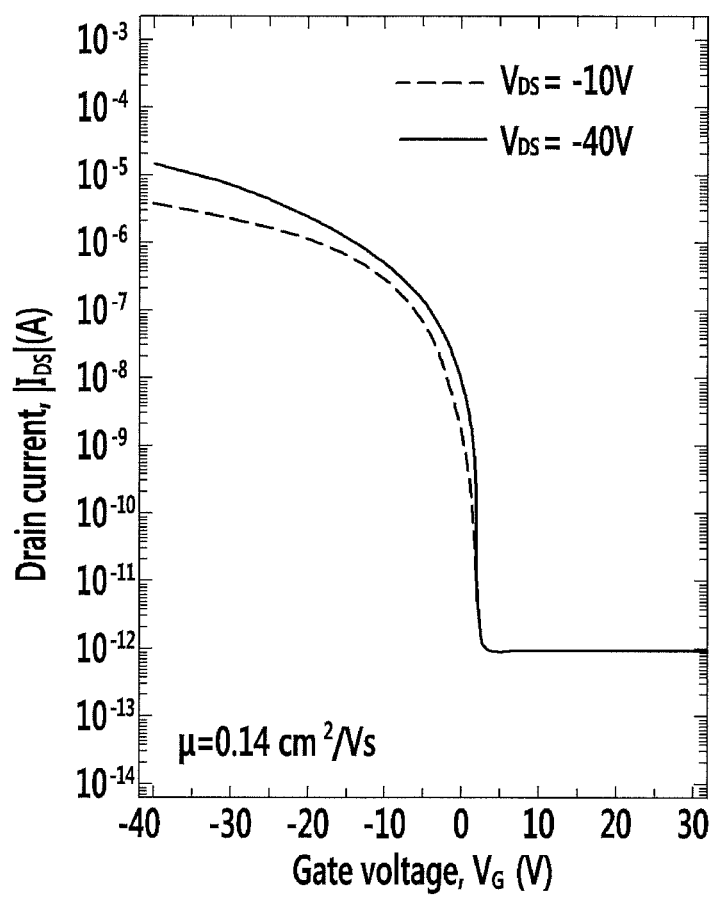
FIG. 12 is a graph showing current characteristics according to gate voltage of the organic thin film transistor according to example embodiments.
Figure 13:
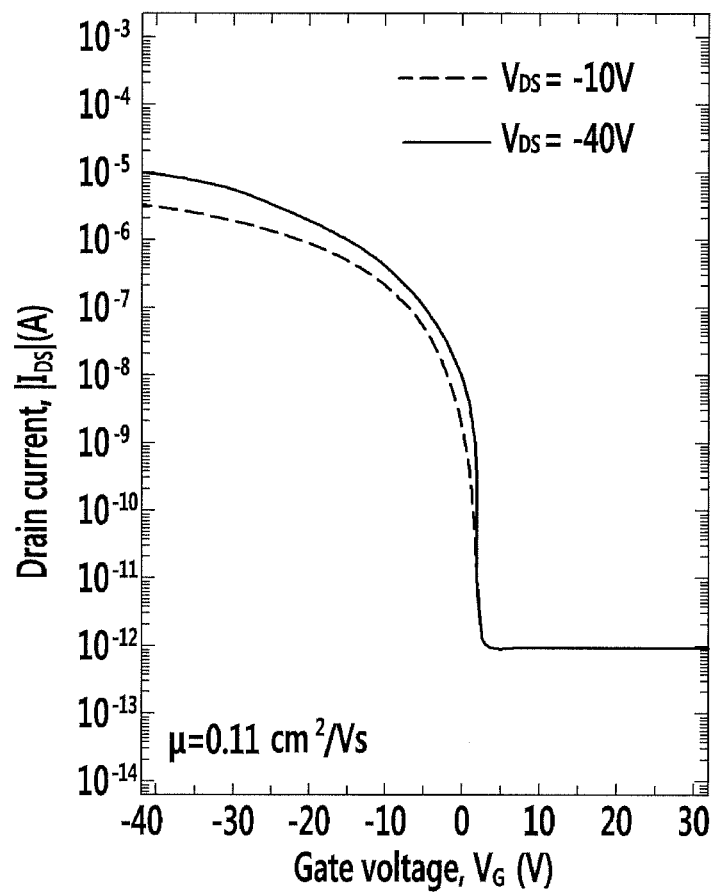
FIG. 13 is a graph showing current characteristics according to gate voltage of the organic thin film transistor of the Comparative Example.

FIG. 12 is a graph showing current characteristics according to gate voltage of the organic thin film transistor of the Example, and FIG. 13 is a graph showing current characteristics according to gate voltage of the organic thin film transistor of the Comparative Example.

Referring to FIGS. 12 and 13, the organic thin film transistor according to the Example has improved current characteristics compared with the organic thin film transistor according to Comparative Example.

Further, charge mobility of the organic thin film transistors according to the Example and Comparative Example are given in Table 1:

[Reaction Formula]

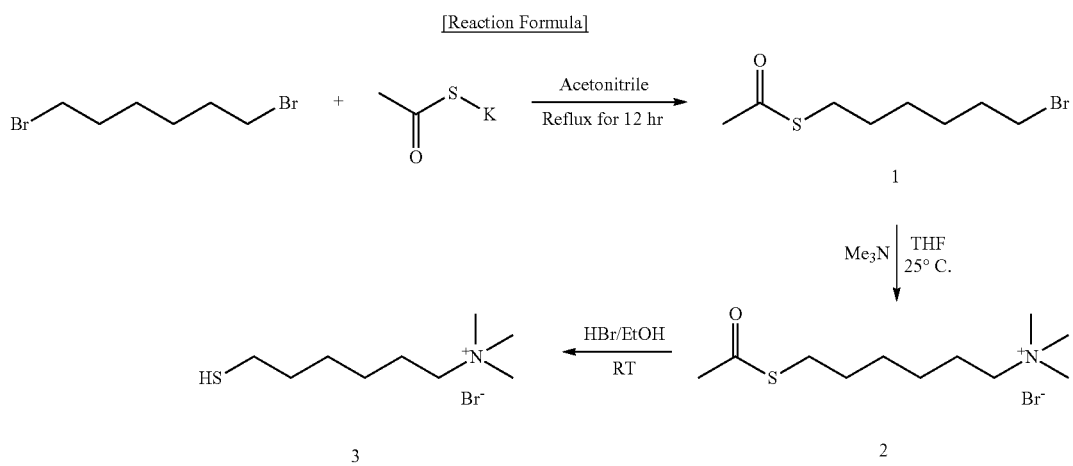

Manufacture of Organic Thin Film Transistor

Example

Molybdenum (Mo) layer is deposited on a glass substrate by sputtering and patterned to form a gate electrode. A silicon oxide film may be formed on the gate electrode by chemical vapor deposition (CVD) with a 300 nm thickness to form a gate insulator. Gold (Au) may be formed on the gate insulator and patterned to a source electrode and a drain electrode (W/L=120 µm/4 µm, 120 µm/6 µm, 120 µm/8 µm, 120 µm/12 µm and 120 µm/20 µm).

Subsequently, Compound 3 obtained above, (6-mercaptohexyl)trimethylammonium bromide, is added to methyl alcohol to form a solution with a concentration of 10 mM.

The substrate is dipped in the solution for 30 min, and then washed using methyl alcohol to form a self-assembled monolayer on the source and the drain electrodes. An organic semiconductor solution including a thiophene-thiazole based copolymer is dropped on the self-assembled monolayer by an inkjet printing method and dried to form an organic semiconductor.

Comparative Example

An organic thin film transistor is manufactured by the same method as the Example, except that the self-assembled monolayer is not formed.

Evaluation 1

Current characteristics of organic thin film transistors according to the Example and the Comparative Example are evaluated.

TABLE 1

| | Charge Mobility(cm$^2$/Vs) |
|---|---|
| Example | 0.14 |
| Comparative Example | 0.11 |

Referring to Table 1, the organic thin film transistor according to the Example has higher charge mobility than that of the organic thin film transistor according to the Comparative Example.

Evaluation 2

Current characteristics of organic thin film transistors according to the Example and the Comparative Example are evaluated.

Figure 14:
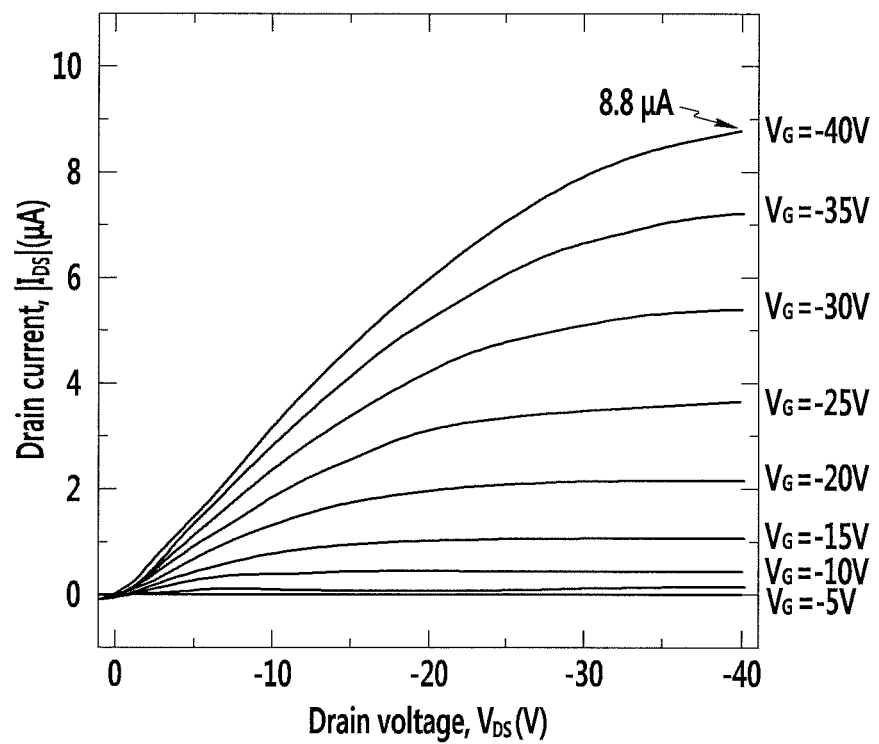
FIG. 14 is a graph showing current characteristics according to gate voltage and drain voltage of the organic thin film transistor according to example embodiments.
Figure 15:
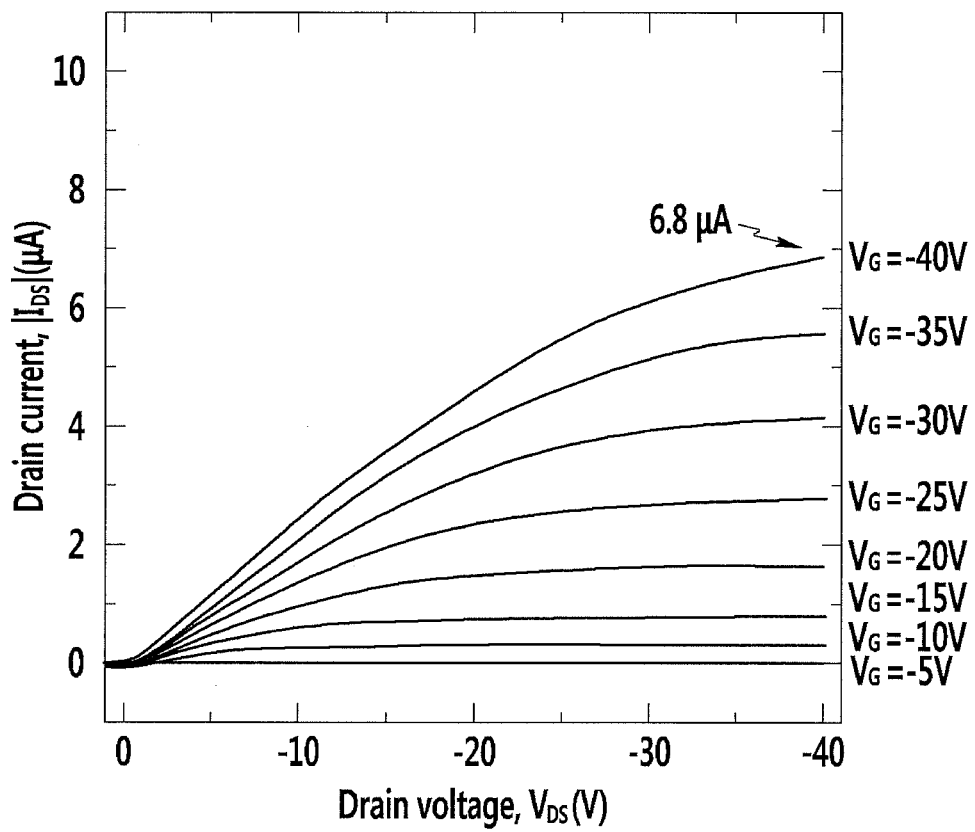
FIG. 15 is a graph showing current characteristics according to gate voltage of the organic thin film transistor of the Comparative Example.

FIG. 14 is a graph showing current characteristics according to gate voltage and drain voltage of the organic thin film transistor of the Example, and FIG. 15 is a graph showing current characteristics according to gate voltage of the organic thin film transistor of the Comparative Example.

Referring to FIGS. 14 and 15, the organic thin film transistor according to the Example has improved current characteristics compared with the organic thin film transistor according to the Comparative Example. For example, in the case of VG=−40V and VDS=−40V, while the thin film transistor according to the Example has a current value of about 8.8 µA, the thin film transistor according to the Comparative Example has a current value of about 6.8 µA.

Evaluation 3

Contact resistance characteristics of organic thin film transistors according to the Example and the Comparative Example are evaluated.

Figure 16:
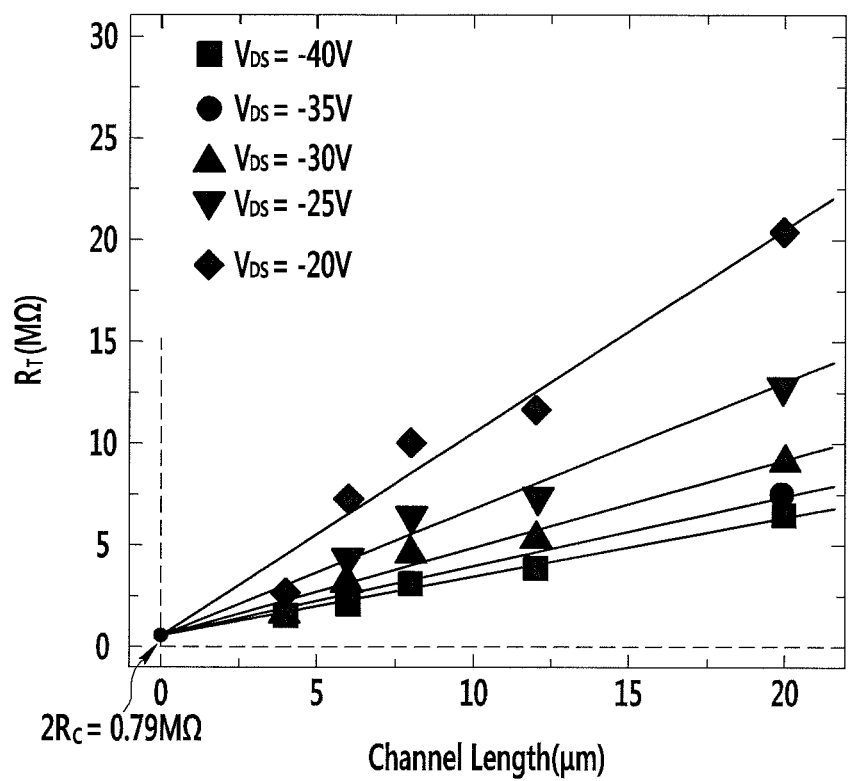
FIG. 16 is a graph showing resistances according to channel lengths of the organic thin film transistor according to example embodiments.
Figure 17:
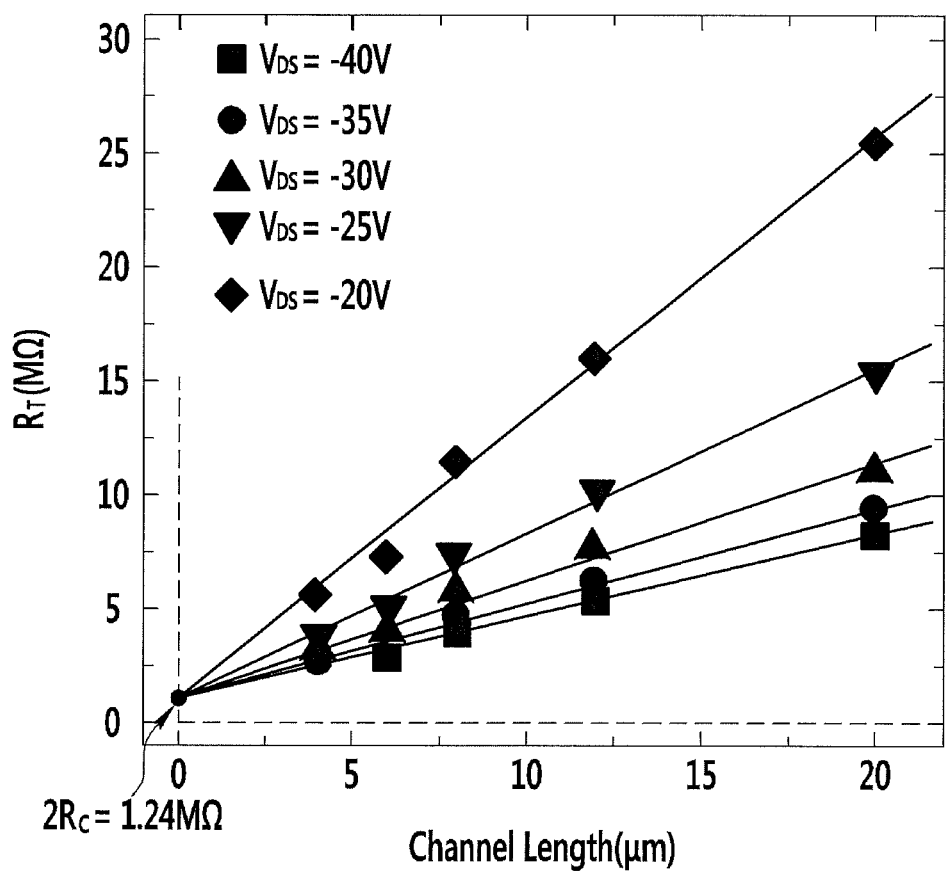
FIG. 17 is a graph showing resistances according to channel lengths of the organic thin film transistor of the Comparative Example.

FIG. 16 is a graph showing resistances according to channel lengths of the organic thin film transistor of the Example, and FIG. 17 is a graph showing resistances according to channel lengths of the organic thin film transistor of the Comparative Example.

Referring to FIGS. 16 and 17, the organic thin film transistor according to the Example has lower contact resistance than the organic thin film transistor according to the Comparative Example.

In detail, the contact resistance is measured by a transfer line method (TLM) and the following equation.

$$R_T = 2R_C + Lr_{ch} \quad \text{[Equation]}$$

The equation, $R_T$ is a total resistance, $R_c$ is a contact resistance, L is a channel length, and $r_{ch}$ is a channel resistance.

Referring to FIGS. 16 and 17, when a channel length (L) is zero, whereas the organic thin film transistor according to the Example has a contact resistance ($R_c$) of about 0.395 MΩ (395 kΩ), the organic thin film transistor according to the Comparative Example has a contact resistance ($R_c$) of about 0.620 MΩ (620 kΩ). From the results, the organic thin film transistor according to the Example has a lower contact resistance than the organic thin film transistor according to the Comparative Example.

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

What is claimed is:

1. An organic semiconductor device, comprising:
   an electrode electrically connected to an organic semiconductor; and
   a self-assembled monolayer positioned between the organic semiconductor and the electrode, the self-assembled monolayer including a monomer having an anchor group at one end and an ionic functional group at another end,
   wherein the anchor group is arranged on a side of the electrode and directly interacts with a metal of the electrode,
   wherein the ionic functional group is arranged on a side of the organic semiconductor and interacts with the organic semiconductor, and
   wherein the ionic functional group includes one of cations and anions, and the self-assembled monolayer includes one of anions and cations configured to form a pair with the respective one of the cations and anions of the ionic functional group.

2. The organic semiconductor device of claim 1, wherein the cations include at least one of substituted or unsubstituted ammonium cations, substituted or unsubstituted sulfonium cations, sodium cations, and a combination thereof, and
   the anions include at least one of bromine anions, borate anions, halide, perchlorate anions, phosphate anions, sulfonate anions, nitrate anions, amide anions, and a combination thereof.

3. The organic semiconductor device of claim 2, wherein the anions include at least one of trifluoromethane sulfonate, trifluoromethanesulfonylamide, tetrakis(1-imidazolyl)borate, tetrakis[3,5-bis(trifluoromethyl)phenyl]borate, $BF_4^-$, $PF_6^-$, $AlCl_4^-$, $Al_2Cl_7^-$, $NO_3^-$, and a combination thereof.

4. The organic semiconductor device of claim 1, wherein the anions include at least one of bromine anions, borate anions, halide, perchlorate anions, phosphate anions, sulfonate anions, nitrate anions, amide anions, and a combination thereof, and
   the cations include at least one of substituted or unsubstituted ammonium cations, substituted or unsubstituted sulfonium cations, sodium cations, and a combination thereof.

5. The organic semiconductor device of claim 1, wherein the self-assembled monolayer includes a monomer represented by the following Chemical Formula 1 or 2:

AC-L-$X_1^+X_2^-$      [Chemical Formula 1]

AC-L-$X_3^-X_4^+$      [Chemical Formula 2]

wherein, in Chemical Formulae 1 and 2,
AC is at least one of —SH, —$SOR^1$, and a combination thereof, $R^1$ may be at least one of hydrogen, substituted or unsubstituted $C_1$ to $C_{30}$ alkyl group, substituted or unsubstituted $C_1$ to $C_{30}$ aryl group, and a combination thereof,
$X_1^+$ is a cation and $X_2^-$ is an anion configured to form a pair with $X_1^+$,
$X_3^-$ is an anion and $X_4^+$ is a cation configured to form a pair with $X_3^-$, and
L is at least one of a single bond, a substituted or unsubstituted $C_1$ to $C_{30}$ alkylene group, a substituted or unsubstituted $C_3$ to $C_{30}$ cycloalkylene group, a substituted or unsubstituted $C_6$ to $C_{30}$ arylene group, a substituted or unsubstituted $C_3$ to $C_{30}$ cycloalkenylene group, a substituted or unsubstituted $C_7$ to $C_{20}$ an arylalkylene group, a substituted or unsubstituted $C_1$ to $C_{20}$ heteroalkylene group, a substituted or unsubstituted $C_2$ to $C_{30}$ heterocycloalkylene group, a substituted or unsubstituted $C_2$ to $C_{30}$ heteroarylene group, a substituted or unsubstituted $C_2$ to $C_{30}$ alkenylene group, a substituted or unsubstituted $C_2$ to $C_{30}$ alkynylene group, a halogen-containing organic group, and a combination thereof.

6. The organic semiconductor device of claim 1, wherein the self-assembled monolayer has a bottom contact structure contacting the organic semiconductor at a bottom surface of the organic semiconductor.

7. The organic semiconductor device of claim 1, wherein the electrode includes at least one of gold (Au), copper (Cu), nickel (Ni), silver (Ag), aluminum (Al), molybdenum (Mo), chromium (Cr), tantalum (Ta), titanium (Ti), and an alloy thereof.

8. The organic semiconductor device of claim 1, wherein the self-assembled monolayer has a thickness of about 2 to about 100 Å.

9. The organic semiconductor device of claim 1, wherein the organic semiconductor device includes at least one of an organic thin film transistor, an organic solar cell, and an organic sensor.

10. A method of manufacturing an organic semiconductor device, comprising:
   providing a self-assembled monolayer on an electrode, the self-assembled monolayer including a monomer having an anchor group at one end and an ionic functional group at another end; and
   providing an organic semiconductor on the self-assembled monolayer,
   wherein the anchor group is arranged on a side of the electrode and directly interacts with a metal of the electrode, and the ionic functional group is arranged on a side of the organic semiconductor and interacts with the organic semiconductor, and wherein the ionic functional group includes one of cations and anions, and the self-assembled monolayer includes one of anions and cations configured to form a pair with the respective one of the cations and anions of the ionic functional group.

11. The method of claim 10, wherein the providing the self-assembled monolayer comprises:
providing the monomer having the anchor group on the electrode to attach the anchor group on a surface of the electrode; and
providing the other end of the monomer with the ionic functional group.

12. The method of claim 11, wherein the providing the monomer on the electrode includes performing at least one method including spin coating, dip coating, and chemical vapor deposition (CVD).

* * * * *